United States Patent
Nittala

(10) Patent No.: US 8,769,364 B2
(45) Date of Patent: Jul. 1, 2014

(54) SYSTEM AND METHOD FOR DIGITAL GAIN ERROR CORRECTION

(75) Inventor: Srikanth Nittala, Bangalore (IN)

(73) Assignee: Analog Devices, Inc., Norwood, MA (US)

( * ) Notice: Subject to any disclaimer, the term of this patent is extended or adjusted under 35 U.S.C. 154(b) by 173 days.

(21) Appl. No.: 13/277,396

(22) Filed: Oct. 20, 2011

(65) Prior Publication Data

US 2013/0103998 A1 Apr. 25, 2013

(51) Int. Cl.

| | | |
|---|---|---|
| *G06F 11/00* | (2006.01) | |
| *G06F 11/30* | (2006.01) | |
| *G08C 25/00* | (2006.01) | |
| *H03M 13/00* | (2006.01) | |
| *H04L 1/00* | (2006.01) | |
| *H04N 1/405* | (2006.01) | |
| *G06F 5/01* | (2006.01) | |
| *H03M 1/06* | (2006.01) | |

(52) U.S. Cl.
CPC ............... *G06F 11/00* (2013.01); *H03M 13/00* (2013.01); *H04N 1/4052* (2013.01); *G06F 5/01* (2013.01); *H03M 1/0641* (2013.01)
USPC .......................................... 714/746; 341/131

(58) Field of Classification Search
USPC .......................................... 714/746; 341/131
See application file for complete search history.

(56) References Cited

U.S. PATENT DOCUMENTS

| | | | | |
|---|---|---|---|---|
| 5,187,481 | A | * | 2/1993 | Hiller ............................ 341/131 |
| 5,311,180 | A | * | 5/1994 | Borgen ......................... 341/131 |
| 5,838,598 | A | | 11/1998 | Hurrell |
| 5,990,815 | A | * | 11/1999 | Linder et al. ................... 341/131 |
| 7,277,033 | B1 | | 10/2007 | Kriz |
| 7,593,483 | B2 | * | 9/2009 | Brooks et al. ................. 375/316 |
| 2005/0040981 | A1 | * | 2/2005 | Miller ............................ 341/152 |
| 2005/0140450 | A1 | | 6/2005 | Pitz |
| 2010/0283641 | A1 | | 11/2010 | Huang |

OTHER PUBLICATIONS

PCT International Search Report from PCT/US2012/054988 mailed on Nov. 19, 2012.

* cited by examiner

*Primary Examiner* — Sam Rizk
(74) *Attorney, Agent, or Firm* — Kenyon & Kenyon, LLP

(57) ABSTRACT

A method for correcting digital gain error for a digital code includes receiving the digital code, generating a random number, adding a first dither to the digital code, in which a magnitude of the first dither is determined based on the random number, performing an operation on the digital code including the added dither with a factor to generate a scaled digital code, and subtracting a second dither corresponding to the first dither from the scaled digital code.

21 Claims, 7 Drawing Sheets

SYSTEM AND METHOD FOR DIGITAL GAIN ERROR CORRECTION

FIELD OF THE INVENTION

The present invention is generally directed to systems and methods for digital gain error corrections. In particular, the present invention is directed to systems and methods that use dithering to mitigate the effects of missing codes resulted from digital gain error corrections.

BACKGROUND INFORMATION

Digital codes in digital circuits may need scaling by multiplying a scale factor to the digital codes. For example, digital outputs of an analog-to-digital converter (ADC) often do not fill out the full range of the ADC. Thus, during the testing process, a scale factor may be determined so that digital outputs from the ADC may be scaled to the full range of the ADC. For example, a 12-bit ADC has a full range of 0 to 4095. However, if the digital outputs are limited to a range of 0 to 4000, the digital outputs may need to be scaled by a factor of 4096/4000≈1.024. The scaling may be achieved by using a digital multiplier (or scaler). FIG. 1A illustrates a system diagram for digital gain error correction. The system includes an ADC 2 and a digital scaler 4. The N-bit ADC 2 converts analog input signals to digital codes $D_n$ which falls into a first range of (0, L) that is less than the full range of the ADC of (0, $2^N-1$). The digital scaler 4 may multiply the digital codes $D_n$ with a scale factor K to generate $D'_n = K*D_n$ so that $D'_n$ may utilize the full range of the ADC.

One issue associated with the digital scaling as shown in FIG. 1A is the missing code problem which is best illustrated by the following example. Assume that $D_n$ is the digital codes before gain correction, and $D'_n$ is the digital codes after gain correction. $D_n$ may be outputs from an ADC or obtained by other means that is known to a person skilled in the art. Further, assuming that a full range of $D_n$ is 0 to 2047, and the scale factor for $D_n$ is $K=(1+(63/2048))$, $D'_n=K*D_n=D_n+(63/2048)*D_n$, where the operation $(63/2048)*D_n$ is implemented as a digital multiplication. Table 1 illustrates a portion of the results to scale $D_n$ to $D'_n$. As illustrated in Table 1, the digital codes $D'_n$ after scaling miss the code "33."

TABLE 1

| $D_n$  | 30 | 31 | 32 | 33 |
|--------|----|----|----|----|
| $D'_n$ | 30 | 31 | 32 | 34 |

While Table 1 shows an example of one missing code, missing codes may periodically occur throughout the full range. Further, since the scaling ratio between $D_n$ and $D'_n$ is fixed, the missing codes for the scaling factor may persistently occur at the same data points and cause patterned noise. The missing codes in the context of analog-to-digital conversions may be measured in terms of differential nonlinearity (DNL) that is defined as the deviation between analog values corresponding to adjacent input digital values. Thus, if there is no missing code after digital scaling, the deviations between analog values corresponding to adjacent input digital values are small, and DNL is correspondingly minimum. However, if there are missing codes after digital scaling, the deviations between analog values corresponding to adjacent input digital values become large, and DNL correspondingly increases.

To solve the missing code problem, current art adds extra bits to increase the resolution for $D_n$. For example, if $D_n$ are codes of N bit long, generated from the output of an ADC, to overcome the missing code problem, an ADC of N+1 bit resolution may be used for analog to digital conversion. FIG. 1B illustrates a system diagram for digital gain error correction using an N+1 bit ADC. Using one extra bit of ADC may limit DNL approximately to ±0.5 least significant bit (LSB). However, adding one extra bit to ADC resolution increases the complexity of the ADC circuitry (larger area and more complicated circuit) and requires more testing.

Besides occurring during scaling (or multiplication), the missing codes may also happen during other types of operations such as division, averaging, and filtering (convolution) in digital signal processing. ADCs may include circuit implementations of these operations in various manners.

DETAILED DESCRIPTION OF EXAMPLE EMBODIMENTS

It is an objective of the present invention to reduce the DNL caused by missing codes that occur during manipulation of digital codes. It is also an objective of the present invention to reduce the patterned noise in digital codes caused by scaling digital codes.

Embodiments of the present invention are directed to a method for correcting digital gain error for a digital code and include receiving the digital code, generating a random number, adding a first dither to the digital code, wherein a magnitude of the first dither is determined based on the random number, performing an operation on the digital code including the added first dither to generate a scaled digital code, and subtracting a second dither corresponding to the first dither from the scaled digital code.

Embodiments of the present invention are directed to a system for correcting digital gain error for a digital code and include a first configuration including a first scaler for multiplying an input of the first configuration with a factor and a second figuration including an adder for adding an input of the second configuration with a dither, a second scaler coupled to an output of the adder for multiplying the output of the adder with the factor, and a subtractor coupled to an output of the scaler for subtracting the dither from the output of the scaler, in which the digital code is selectively provided to one of the first and second configurations.

To achieve these objectives, in one embodiment of the present invention, a small amount of dither may be added to a digital code prior to scaling and then the small amount of dither may be subtracted from the scaled digital code after scaling. To further improve noise performance, different magnitudes of dither may be generated so that they may be selectively, in a pseudo-random manner, added to a digital code prior to scaling and be subtracted from the scaled digital code after scaling. As such, missing codes may be eliminated or reduced, and the DNL may be improved.

Figure 2:
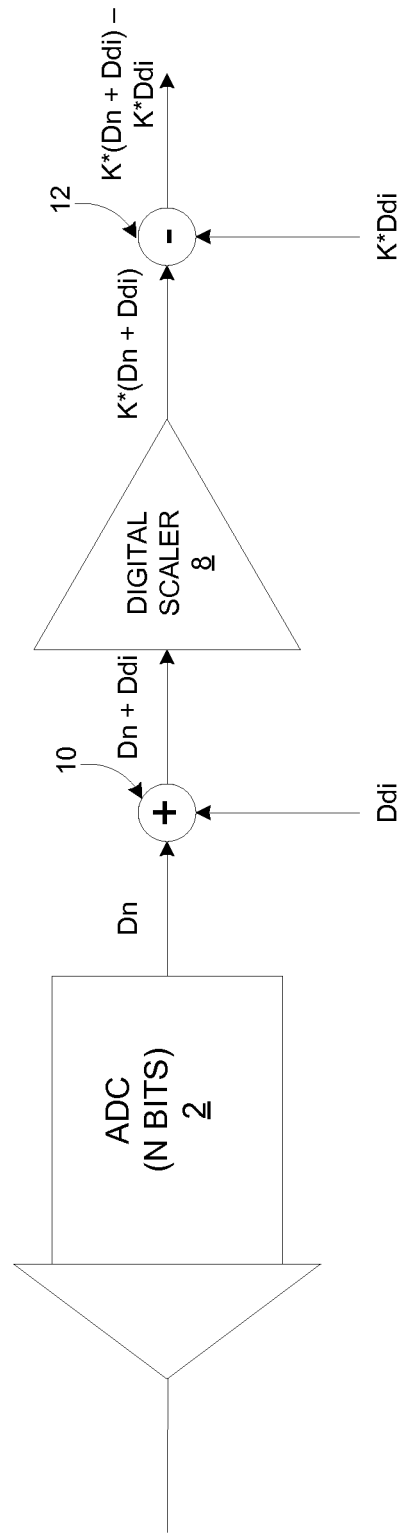
FIG. 2 illustrates a system diagram for digital gain error correction using dithering according to an exemplary embodiment of the present invention.

While the following embodiments may be discussed in terms of scaling of digital codes for the convenience of illustration, the invention is not limited to scaling and may be extended to other types of operations on digital codes such as division, averaging, and filtering. FIG. 2 illustrates a system diagram for digital gain error correction using dithering according to an exemplary embodiment of the present invention. The system as shown in FIG. 2 may include an ADC 2, a digital scaler 8, an adder 10 and a subtractor 12. The ADC 2 may convert an input analog signal into digital codes $D_n$. Prior to scaling, a dither ($D_{di}$) may be added to $D_n$ using adder 10 to generate an output of $D_n+D_{di}$ which may be an input to the digital scaler 8. The digital scaler 8 may digitally multiply a scale factor K to generate an output of $K*(D_n+D_{di})$. Finally, subtractor 12 may subtract a scaled dither $K*D_{di}$ from $K*(D_n+D_{di})$ to generate the gain-corrected output $D''_n=K*(D_n+D_{di})-K*D_{di}$.

The following specific example may help understand the system as illustrated in FIG. 2. In this example, a dither of 2 LSB is added to the digital code prior to being scaled by a scale factor of (1+63/2048) for a range of (0, 2048). The dither may be subsequently subtracted from the scaled code. Thus, the eventual output may be $D''_n=(D_n+2)*(1+63/2048)-2*(1+63/2048)=D_n+(D_n+2)*63/2048)-2*63/2048 \approx D_n+(D_n+2)*63/2048)$ since $2*63/2048$ may be ignored in digital multiplication. Table 2 compares the digital codes $D'_n$ mixed with dither with the original digital code $D_n$.

TABLE 2

| $D_n$ | 30 | 31 | 32 | 33 |
|---|---|---|---|---|
| $D''_n$ | 30 | 32 | 33 | 34 |

Figure 1A:
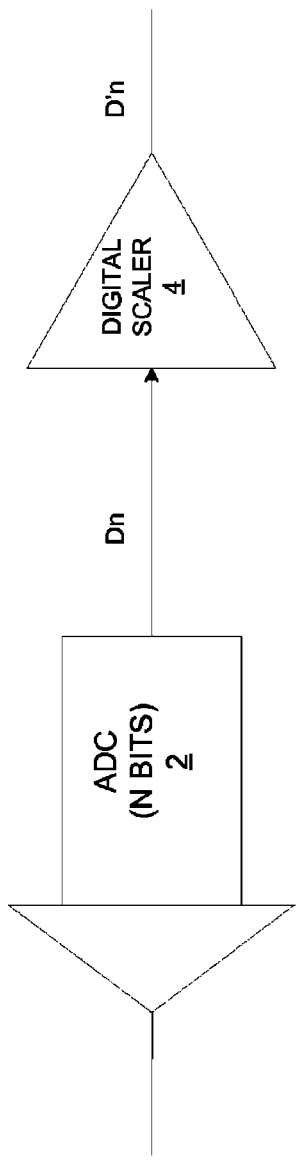
FIG. 1A illustrates a system diagram for digital gain error correction.
Figure 1B:
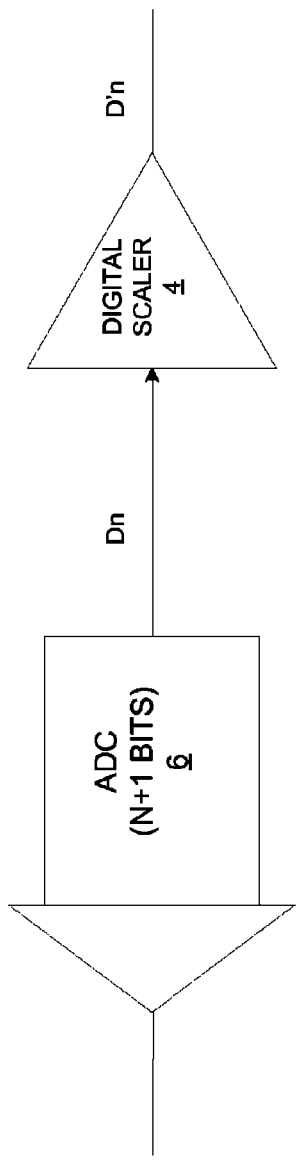
FIG. 1B illustrates a system diagram for digital gain error correction using an N+1 bit ADC.
Figure 3:
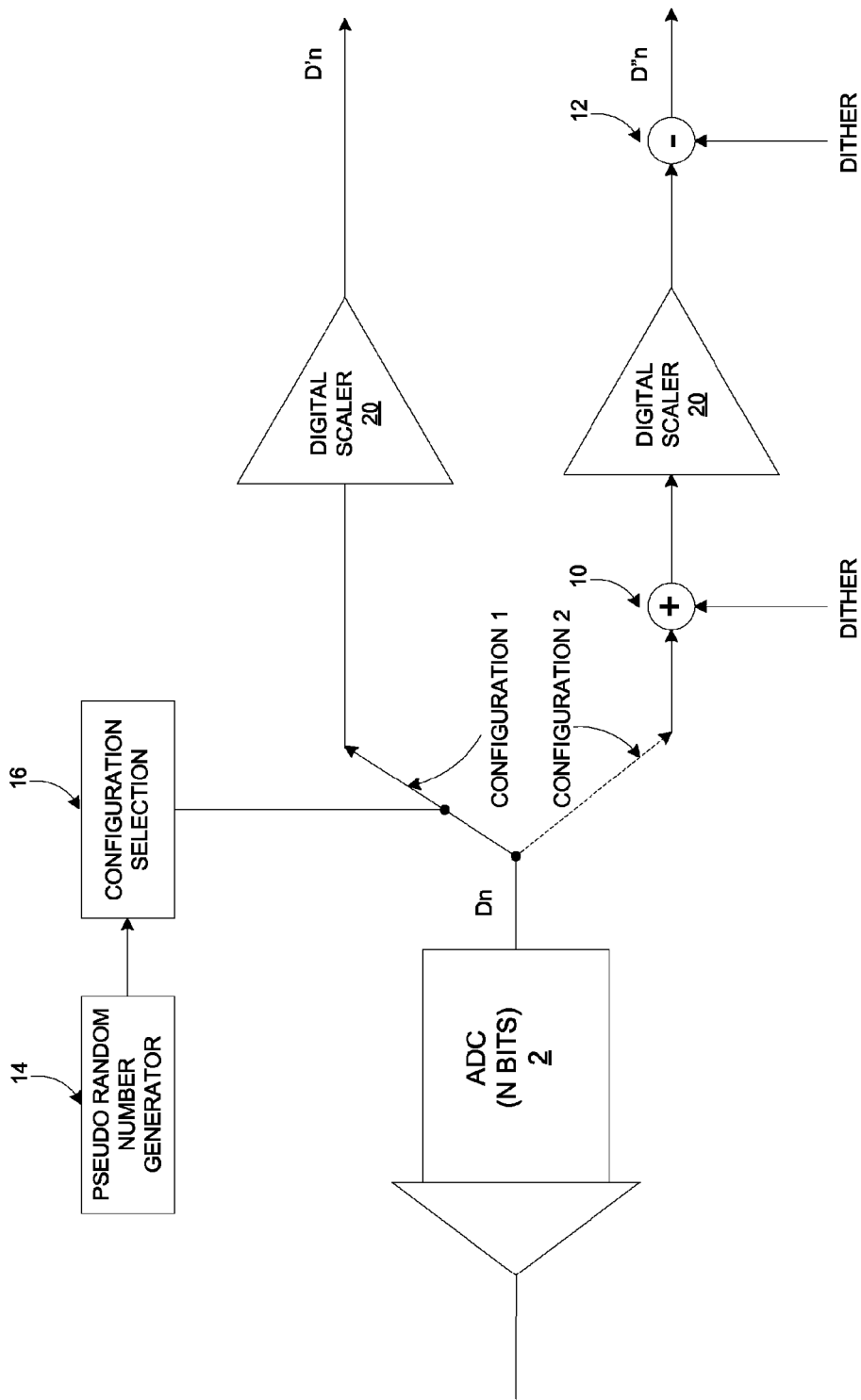
FIG. 3 illustrates a system diagram for digital gain error correction by selectively switching between dithering and non-dithering correction according to an exemplary embodiment of the present invention.

It is noted that the eventual output $D''_n$ still miss a code "31." To reduce or eliminate the missing codes, the eventual output may be pseudo-randomly selected from codes generated from adding/subtracting different magnitudes of dithers (or no dither). FIG. 3 illustrates a system diagram for digital gain error correction by selectively switching between dithering and non-dithering correction according to an exemplary embodiment of the present invention. As shown in FIG. 3, the error correction system may include an ADC 2 that outputs digital codes $D_n$ that may need digital gain error correction. Unlike previous approach that uses a single fixed scaling configuration as shown in FIG. 1A or FIG. 2, the system as shown in FIG. 3 may selectively use either a configuration 1 or a configuration 2 for scaling. The configuration 1 may correspond to the system as shown in FIG. 1A in which the digital code is scaled without dither. The configuration 2 may correspond to the system as shown in FIG. 2 in which the dither is added prior to scaling and is subtracted after scaling. The system as shown in FIG. 3 may further include a pseudo-random number generator 14 and a selection module 16. Thus, the pseudo-random number generator 14 may generate a random number based on which the selection module 16 may randomly engage $D_n$ to configuration 1 or configuration 2 for digital gain error correction. In this way, the DNL error may be reduced, and the missing codes may be eliminated or reduced. For example, if the dither 2 LSB as discussed above, Table 3 illustrates all of the possible scaled digital codes from configurations 1 and 2. As shown in Table 3, for each digital code of $D_n$, there would be at least one code from configuration 1 or 2 corresponds to the digital code. When the output is randomly selected from configuration 1 or 2, the chance that missing codes occur may be reduced.

TABLE 3

| $D_n$ | 30 | 31 | 32 | 33 |
|---|---|---|---|---|
| $D'_n$ (Configuration 1) | 30 | 31 | 32 | 34 |
| $D''_n$ (Configuration 2) | 30 | 32 | 33 | 34 |

Figure 4:
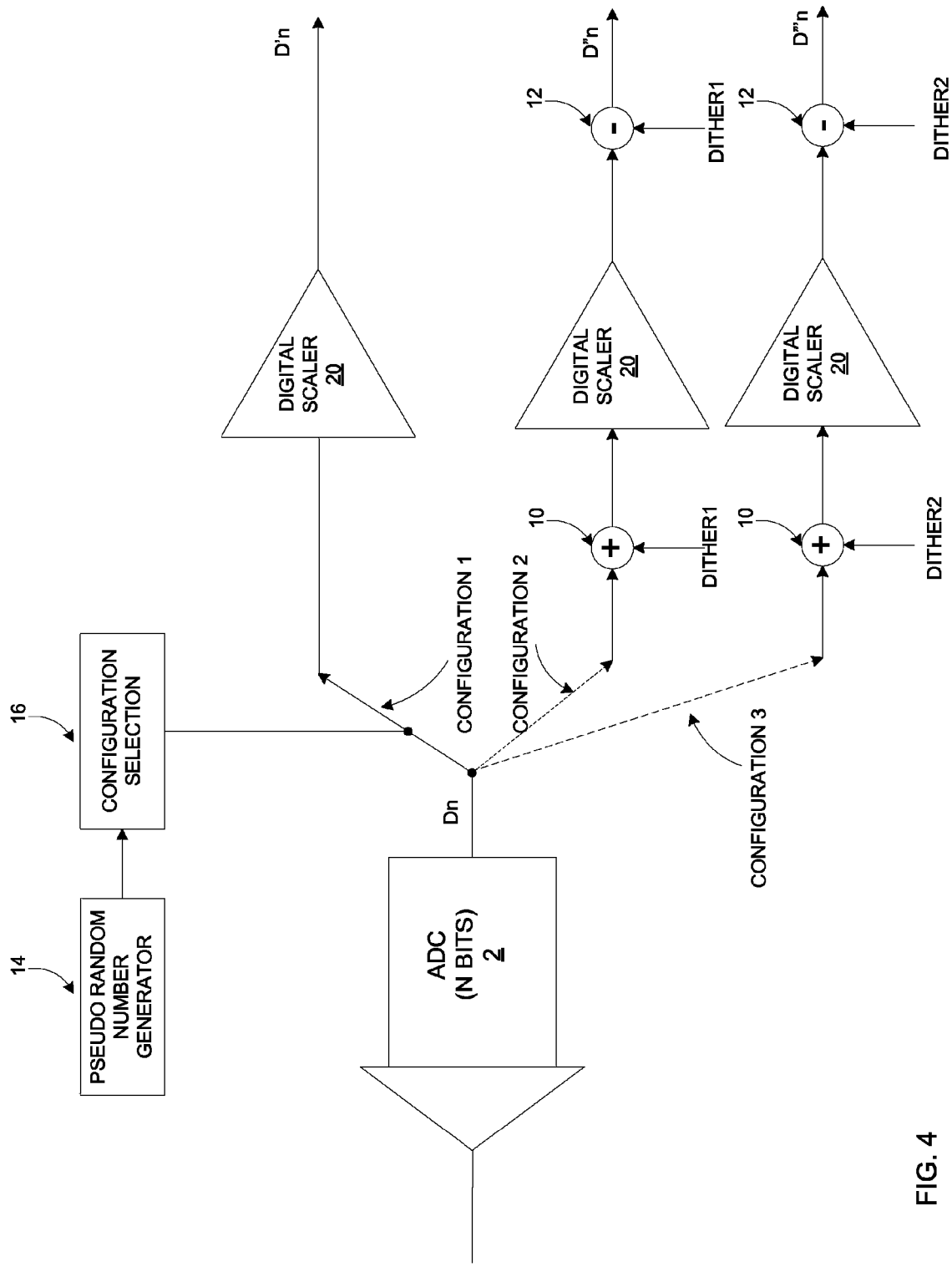
FIG. 4 illustrates a system diagram for digital gain error correction by selectively switching among corrections of different magnitudes of dithering according to an exemplary embodiment of the present invention.

The chance of missing code may be further reduced when different magnitudes of dither are used to generate scaled digital codes for the random selection. FIG. 4 illustrates a system diagram for digital gain error correction by selectively switching among corrections of different magnitudes of dithering according to an exemplary embodiment of the present invention. The system as shown in FIG. 4 may include multiple configurations each of which may include a different magnitude of dither (or no dither) for addition prior to scaling and subtraction after scaling. Configuration 1 may scale digital codes $D_n$ without dithering. Configuration 2 may scale digital codes $D_n$ using a first dither having a first magnitude, while configuration 3 may scale digital codes $D_n$ using a second dither having a second dither magnitude. For example, the first dither magnitude may be 2 LSB, while the second dither magnitude may be 3 LSB. Further configurations may be similarly added to the system as shown in FIG. 4. The pseudo-random number generator 14 may generate a random number based on which the selection module 16 may randomly engage $D_n$ to one of the multiple configurations for digital gain error correction.

Figure 5:
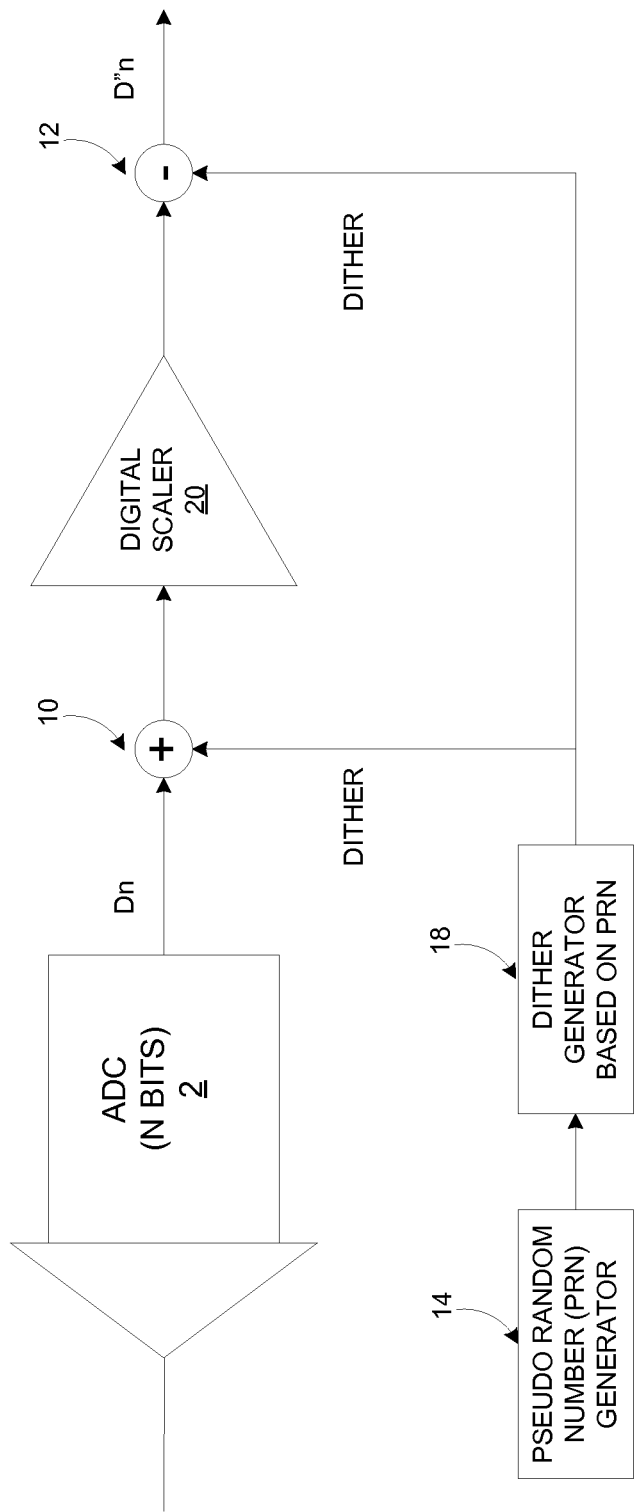
FIG. 5 illustrates a system diagram for digital gain error correction according to another exemplary embodiment of the present invention.

Instead of switching among different configurations of different magnitudes of dither as shown in FIGS. 3 and 4, FIG. 5 illustrates an exemplary system diagram for digital gain error correction in which randomly generated dithers may be added before digital scaling and subtracted thereafter. Referring to FIG. 5, the exemplary system may similarly include an ADC 2, an adder 10, a digital scaler 20, and a subtractor 12. A digital code output (Dn) of the ADC 2 may be coupled to a first input of the adder 10. A second input of the adder 10 may receive a dither. The digital code Dn plus the dither may be digitally multiplied by a scale factor at the digital scaler 20. The subtractor 12 may subtract the dither from the output of the digital scaler 12 to generate the corrected codes. The magnitude of the dither may be determined randomly. In one exemplary embodiment as shown in FIG. 5, a pseudo random number generator 14 may be synchronized with the ADC via a clock (not shown) so that at each analog-to-digital conversion cycle, the pseudo random number generator 14 may generate a pseudo random number (PRN) which may be fed into a dither generator 18. The dither generator 18 may generate a dither whose magnitudes are determined as function of the PRN. For example, the magnitudes may vary among (0, 1, 2) times of a unit magnitude, or any suitable combination of different magnitudes. The generated dithers may be fed to the adder 10 and subtractor 12 to be mixed with the digital code Dn.

Figure 6:
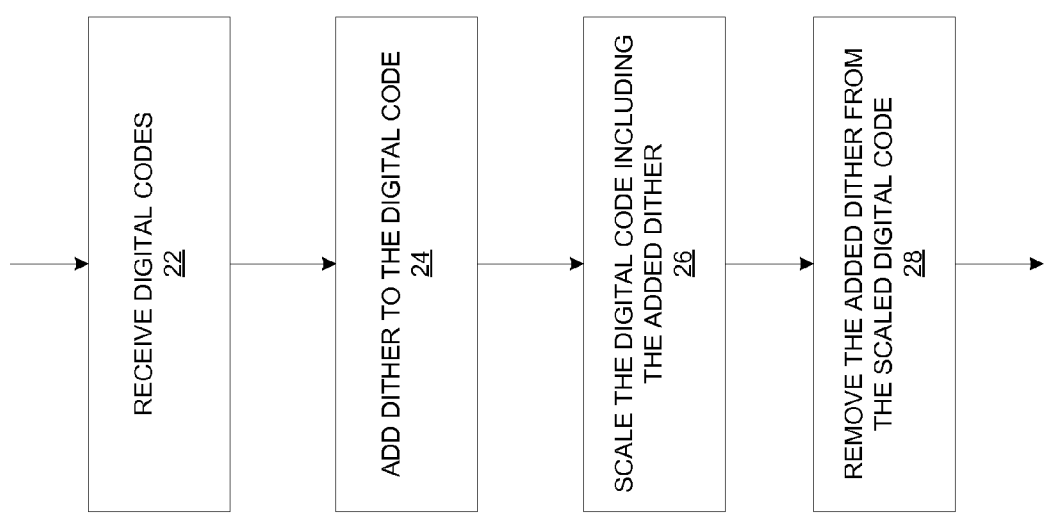
FIG. 6 illustrates a method for digital gain error correction according to an exemplary embodiment of the present invention.

FIG. 6 illustrates a method for digital gain error correction according to an exemplary embodiment of the present invention. At 22, a processor (not shown) may be configured to receive a digital code $D_n$. The digital code $D_n$ may be from the output of an ADC or from a suitable means known to a skilled artisan. At 24, a dither of a certain dither magnitude $D_{di}$ may be added to the digital codes $D_n$ to obtain digital codes including dither $D_n+D_{di}$. At 26, the digital code including dither may be scaled by digitally multiplying a scale factor K to obtain $K*(D_n+D_{di})$. At 28, the added dither may be removed from $K*(D_n+D_{di})$ for digital gain error correction. This process may continue for each digital codes such as those from an ADC.

Figure 7:
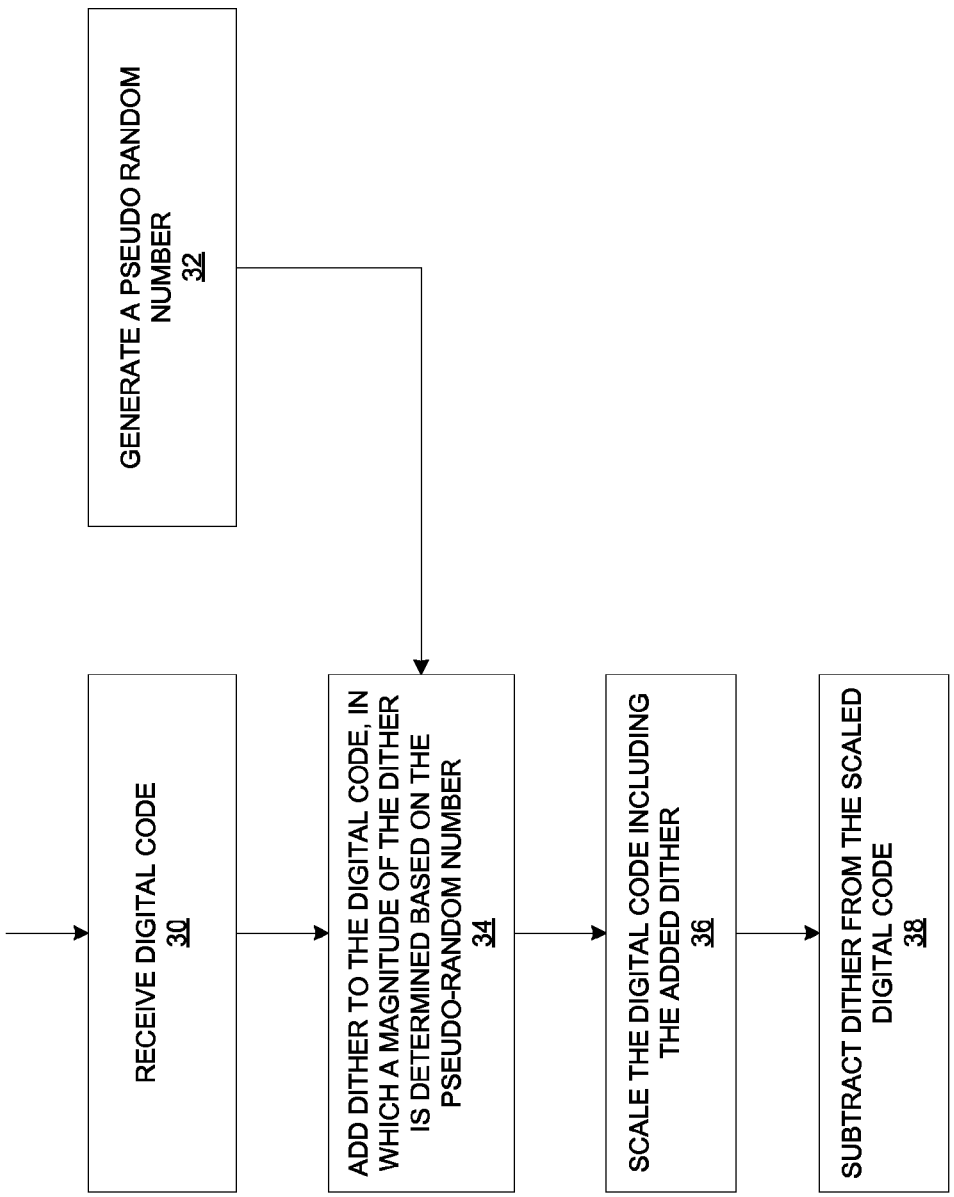
FIG. 7 illustrates another method for digital gain error correction according to an exemplary embodiment of the present invention.

FIG. 7 illustrates another method for digital gain error correction according to an exemplary embodiment of the present invention. In this embodiment, dithers of different magnitudes may be randomly and selectively used in digital gain error correction. At 30, a processor (not shown) may be configured to receive a digital code $D_n$. The digital code $D_n$ may be from the output of an ADC or from a suitable means known to a skilled artisan. At 32, a pseudo-random number may be generated. At 34, a dither may be added to the digital code $D_n$, where a magnitude of the dither may be determined based on the generated pseudo-random number—i.e., different pseudo-random numbers may correspond to different magnitudes of dither. At 36, the digital code along with the added dither may be digitally multiplied with a scale factor. At 38, the dither (scaled with the same scaling factor) may be subtracted from the scaled digital code to achieve digital gain error correction for the digital code $D_n$. This process may continue for each digital codes such as those from an ADC.

As discussed above, the present invention is not limited to mitigation of missing codes occurred during scaling digital codes. Instead, the present invention is applicable to other types of operations on digital codes. For example, the digital scaler of the exemplary embodiments as illustrated in FIGS. 2 to 5 may be replaced with a division operator, or an averaging operator, or a filtering (such as convolution) operator, or other types of operations that may be found in digital signal processing.

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

What is claimed is:

1. A computer-implemented method for correcting digital gain error for a digital code, comprising:
   receiving, at a first input of an adder, the digital code;
   generating, by a random number generator, a random number;
   digitally adding, by the adder, a digital first dither, received at a second input of the adder, to the digital code to produce a summed digital code at an output of the adder, wherein a magnitude of the first dither is determined based on the random number;
   receiving the summed digital code provided at the output of the adder at an input of a digital scaler;
   performing, by the digital scaler, a scaling operation on the summed digital code to generate a scaled digital code; and
   subtracting, by a subtractor, a second dither corresponding to the first dither from the scaled digital code.

2. The method of claim 1, wherein the digital code is generated from an analog-to-digital converter.

3. The method of claim 1, wherein the operation is a multiplying operation with a scale factor.

4. The method of claim 1, wherein the operation is a divisional operation.

5. The method of claim 1, wherein the operation is an averaging operation.

6. The method of claim 1, wherein the operation is a filtering operation.

7. The method of claim 1, wherein the magnitude of the first dither is selected from zero or one time of a unit amount.

8. The method of claim 1, wherein the magnitude of the first dither is selected from zero, one, or two times of a unit amount.

9. The method of claim 1, wherein the operation is a digital multiplication.

10. A system for correcting digital gain error for a digital code, comprising:
    an adder including a first input for receiving the digital code, a second input for receiving a digital first dither, and an output, the adder digitally summing the digital code and the first dither to produce a summed digital code at the output;
    a digital scaler having an input connected directly to the output of the adder for implementing a scaling operation on the summed digital code and outputting a scaled digital code at an output of the digital scaler; and
    a subtractor including a first input coupled to the output of the digital scaler, a second input for receiving a second dither corresponding to the first dither, and an output for outputting a difference between the first and second inputs of the subtractor,
    wherein a magnitude of the first dither is randomly generated.

11. The system of claim 10, further comprising an analog-to-digital converter (ADC) for generating the digital code.

12. The system of claim 10, wherein the operation is a multiplying operation with a scale factor.

13. The system of claim 10, wherein the operation is a divisional operation.

14. The system of claim 10, wherein the operation is an averaging operation.

15. The system of claim 10, wherein the operation is a filtering operation.

16. The system of claim 10, wherein the magnitude of the first dither is randomly generated based on a random number generated by a pseudo random number generator.

17. The system of claim 11, wherein the ADC and the pseudo random number generator are synchronized according to a clock.

18. The system of claim 10, wherein the magnitude of the first dither is selected from zero or one time of a unit amount.

19. The system of claim 10, wherein the magnitude of the first dither is determined from one of zero, one, and two times of a unit amount.

20. A system for correcting digital gain error for a digital code, comprising:
    a first configuration including a first digital scaler for multiplying an input of the first configuration with a factor;
    a second configuration including:
        an adder including a first input for receiving an input of the second configuration, a second input for receiving a digital dither, and an output, the adder digitally adding the input of the second configuration with the digital dither to produce a summed digital code at the output;

a second digital scaler coupled directly to the output of the adder for multiplying the output of the adder with the factor; and a subtractor coupled to an output of the second digital scaler for subtracting the digital dither from the output of the second digital scaler, wherein the digital code is selectively provided to one of the first and second configurations.

21. A machine-readable non-transitory medium stored thereon executable codes that, when executed, perform a method for correcting digital gain error for a digital code, the method comprising:

receiving, at a first input of an adder, the digital code;

generating, by a random number generator, a random number;

digitally adding, by the adder, a digital first dither, received at a second input of the adder, to the digital code to produce a summed digital code at an output of the adder, wherein a magnitude of the first dither is determined based on the random number;

receiving the summed digital code provided at the output of the adder at an input of a digital scaler;

performing, by the digital a scaling operation on the summed digital code to generate a scaled digital code; and subtracting, by a subtractor, a second dither corresponding to the first dither from the scaled digital code.

* * * * *

UNITED STATES PATENT AND TRADEMARK OFFICE
CERTIFICATE OF CORRECTION

PATENT NO. : 8,769,364 B2
APPLICATION NO. : 13/277396
DATED : July 1, 2014
INVENTOR(S) : Srikanth Nittala It is certified that error appears in the above-identified patent and that said Letters Patent is hereby corrected as shown below:

In the Claims

Column 7, line 26, Claim 21, please change:

"the digital a scaling" to --the digital scaler, a scaling--.

Signed and Sealed this
Third Day of February, 2015

Michelle K. Lee
*Deputy Director of the United States Patent and Trademark Office*